(12) United States Patent
Wu et al.

(10) Patent No.: US 9,362,337 B1
(45) Date of Patent: Jun. 7, 2016

(54) NON-VOLATILE STORAGE UNIT AND NON-VOLATILE STORAGE DEVICE

(71) Applicants: Ningbo Advanced Memory Technology Corp., Jubei, Hsinchu County (TW); Being Advanced Memory Taiwan Limited, Jubei, Hsinchu County (TW)

(72) Inventors: Jui-Jen Wu, Jubei (TW); Jiah-Wang Chang, Jubei (TW); Sheng-Tsai Huang, Jubei (TW); Fan-Yi Jien, Jubei (TW)

(73) Assignees: NINGBO ADVANCED MEMORY TECHNOLOGY CORP., Jubei, Hsinchu County (TW); BEING ADVANCED MEMORY TAIWAN LIMITED, Jubei, Hsinchu County (TW)

( * ) Notice: Subject to any disclaimer, the term of this patent is extended or adjusted under 35 U.S.C. 154(b) by 0 days.

(21) Appl. No.: 14/863,844

(22) Filed: Sep. 24, 2015

(30) Foreign Application Priority Data

Jul. 22, 2015 (CN) .......................... 2015 1 0433378

(51) Int. Cl.
 *H01L 47/00* (2006.01)
 *H01L 27/24* (2006.01)
 *H01L 27/22* (2006.01)
 *H01L 27/115* (2006.01)

(52) U.S. Cl.
 CPC ...... *H01L 27/2436* (2013.01); *H01L 27/11502* (2013.01); *H01L 27/228* (2013.01)

(58) Field of Classification Search
 CPC .............. H01L 27/2436; H01L 27/228; H01L 27/11502
 USPC ............................................................. 257/4
 See application file for complete search history.

(56) References Cited

U.S. PATENT DOCUMENTS

| 7,675,765 B2 | 3/2010 | Derharcobian et al. |
| 8,633,548 B2 | 1/2014 | Dhaoui et al. |
| 2010/0177560 A1 | 7/2010 | McElheny et al. |
| 2014/0292368 A1* | 10/2014 | Nazarian ............... H01L 27/101 326/16 |
| 2015/0371705 A1* | 12/2015 | Onkaraiah ......... G11C 13/0007 327/208 |
| 2016/0012886 A1* | 1/2016 | Nazarian .............. G11C 13/004 365/148 |

* cited by examiner

*Primary Examiner* — David S Blum
(74) *Attorney, Agent, or Firm* — Muncy, Geissler, Olds & Lowe, P.C.

(57) ABSTRACT

A non-volatile storage device adopt memristors to store data and uses fewer transistors to realize the same circuit function, whereby to decrease the chip area and reduce the time and energy spent in initiating the device. Further, the non-volatile storage device disposes appropriate electronic elements in the spacing between adjacent memristors to meet the layout design rule and achieve high space efficiency in the chip lest the space between memristors be wasted.

10 Claims, 4 Drawing Sheets

NON-VOLATILE STORAGE UNIT AND NON-VOLATILE STORAGE DEVICE

BACKGROUND OF THE INVENTION

1. Field of the Invention

The present invention relates to a storage unit and a storage device, particularly to a non-volatile storage unit and a non-volatile storage device.

2. Description of the Prior Art

The programmable logic device (PLD) is a programmable and reprogrammable configuration element. The logic functions and/or related route paths of PLD can be programmed or reprogrammed via writing new data to the configuration elements. It should be further annotated: PLD is also called the programmable array logic (PAL), the programmable logic array (PLA), the field programmable gate array (FPGA) or other devices with similar functions.

The conventional configuration elements of PLD are normally realized with 6-transistor static random access memories (6T SRAM). It is well known by the persons skilled in the art: the 6T SRAM is likely to be affected by soft errors. The probability of soft errors increases with the decrease of the element size or the decrease of the voltage applied to the elements. Further, SRAM is a volatile memory into which configuration data needs to be loaded while initializing a PLD, and that, therefore, consumes a longer period of time.

The content addressable memory (CAM) can be used to compare the input data and the data stored in SRAM and output the result of comparison. CAM may also suffer the same defect as SRAM. A current solution to the abovementioned problem is using memristors to replace SRAM. In order to meet the layout design rule, appropriate spacing should be reserved for two adjacent memristors (such as phase-change memories). Thus, a memristor-based memory would occupy a larger area in a chip.

Accordingly, it is highly desirable to propose a compact-layout non-volatile storage device applicable to PLD and CAM.

SUMMARY OF THE INVENTION

The present invention provides a non-volatile storage unit and a non-volatile storage device, which use fewer transistors to realize the function of circuits and use memristors to store data, whereby the chip area is reduced, initiation is accelerated, and energy consumption is decreased. The present invention further disposes appropriate electronic elements between adjacent memristors to meet the layout design rule and fully utilize the spacing between memristors lest the space of a chip be wasted.

One embodiment of the present invention proposes a non-volatile storage unit, which comprises a first memristor, a first switch, a second memristor, and a write-data circuit. The first memristor has a first end and a second end, wherein the first end of the first memristor is connected with a bit line. The first switch has a first end, a second end and a control end, wherein the first end of the first switch is connected with the second end of the first memristor, and the control end of the first switch is connected with a read-word line. The second memristor has a first and a second end, wherein the first end of the second memristor is connected with the second end of the first switch, and the second end of the second memristor is connected with a bit line bar. The write-data circuit is electrically coupled to the first end of the first switch, the second end of the first switch, a program line, and a system ground terminal.

Another embodiment of the present invention proposes a non-volatile storage device, which comprises a plurality of abovementioned non-volatile storage units, wherein each non-volatile storage unit stores a bit of data, and each non-volatile storage unit is coupled to a read-word line, a bit line, a bit line bar, a program line, a match line and a system ground terminal, which are corresponding the non-volatile storage unit.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

Figure 1:
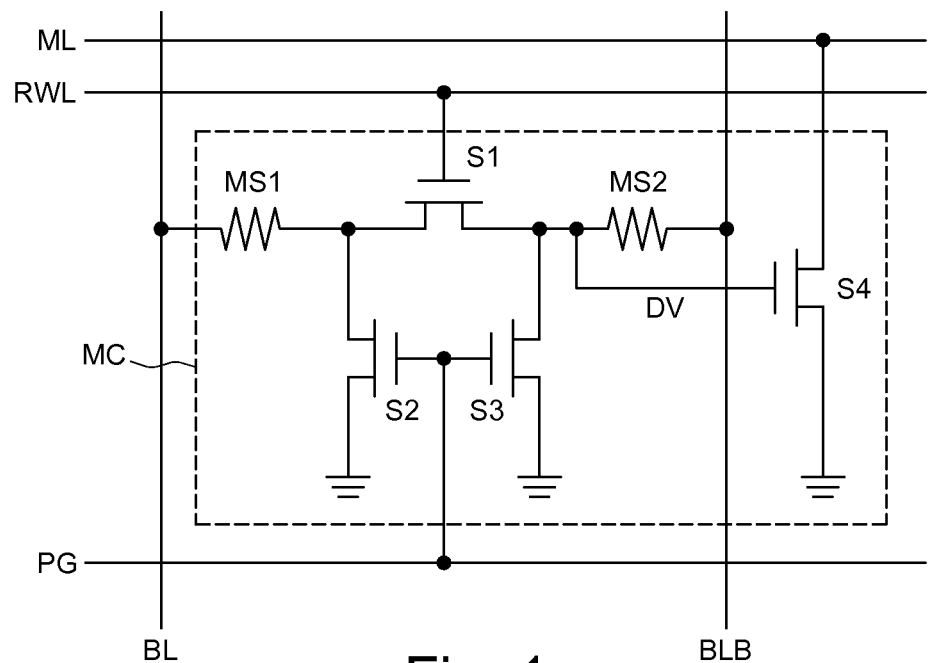
FIG. 1 is a diagram schematically showing a non-volatile storage unit according to one embodiment of the present invention.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily.

Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Referring to FIG. 1, FIG. 1 illustrates a non-volatile storage unit according to one embodiment of the present invention, wherein the non-volatile storage unit is applied to content addressable memory (CAM) for exemplification. The non-volatile storage unit MC comprises a first memristor MS1, a first switch S1, a second memristor MS2, and a write-data circuit. The first memristor MS1 has a first end and a second end, and the first end of the first memristor MS1 is connected with a bit line BL. The first switch S1 has a first end, a second end and a control end; the first end of the first switch S1 is connected with the second end of the first memristor MS1; the control end of the first switch S1 is connected with a read-word line RWL. The second memristor MS2 has a first and a second end; the first end of the second memristor MS2 is connected with the second end of the first switch S1; the second end of the second memristor MS2 is connected with a bit line bar BLB. Generally, the input signal of the bit line BL is opposite to the input signal of the bit line bar BLB. For example, while the input signal of the bit line BL is a high-level voltage, the input signal of the bit line bar BLB is a low-level voltage; while the input signal of the bit line BL is a low-level voltage, the input signal of the bit line bar BLB is a high-level voltage.

The write-data circuit is electrically coupled to the first end of the first switch S1, the second end of the first switch S1, a program line PG, and a system ground terminal. In the embodiment shown in FIG. 1, the write-data circuit includes a second switch S2 and a third switch S3. The second switch S2 has a first end, a second end and a control end; the first end of the second switch S2 is connected with the first end of the first switch S1 and the second end of the first memristor MS1; the second end of the second switch S2 is electrically connected with the system ground terminal. The third switch S3 also has a first end, a second end and a control end; the first end of the third switch S3 is connected with the second end of the first switch S1 and the first end of the second memristor MS2; the second end of the third switch S3 is electrically connected with the system ground terminal. The control end of the second switch S2 and the control end of the third switch S3 are jointly electrically connected with the program line PG.

Figure 2:
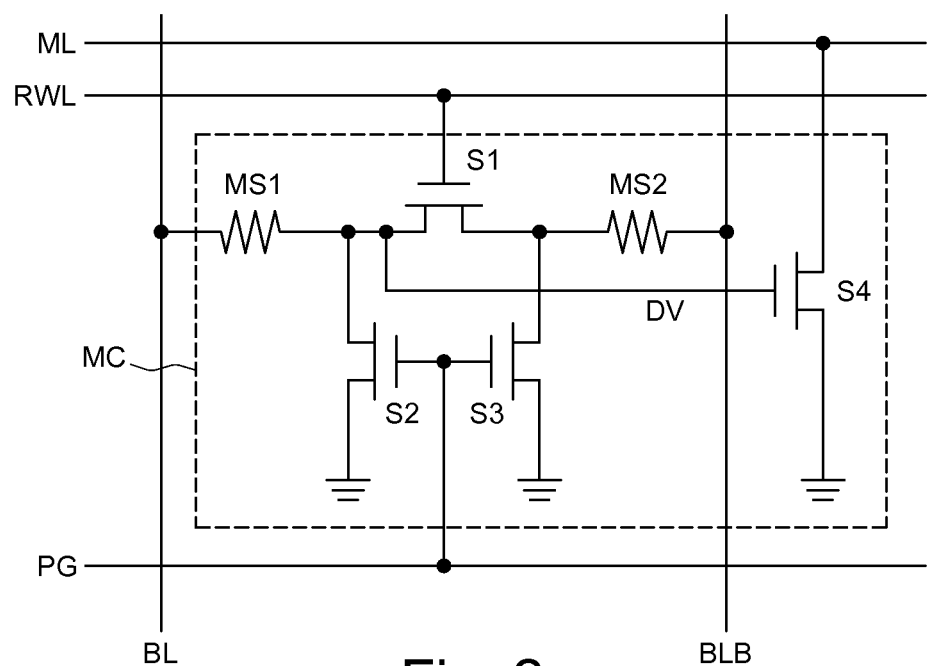
FIG. 2 is a diagram schematically showing a non-volatile storage unit according to another embodiment of the present invention.

In one embodiment, the non-volatile storage unit MC further comprises a fourth switch S4. The fourth switch S4 has a first end, a second end and a control end; the first end of the fourth switch S4 is connected with a match line ML; the second end of the fourth switch S4 is electrically connected with the system ground terminal; the control end of the fourth switch S4 is connected with the second end of the first switch S1 and the first end of the second memristor MS2, as shown in FIG. 1 but not limited thereto. In one embodiment, the control end of the fourth switch S4 is connected with the first end of the first switch S1 and the second end of the first memristor MS1, as shown in FIG. 2. In the embodiment shown in FIG. 1 or FIG. 2, a divided voltage DV between the first memristor MS1 and the second memristor MS2 can control the fourth switch S4 to turn on or off. Thus, the voltage output of the match line ML varies with the divided voltage DV between the first memristor MS1 and the second memristor MS2.

In one embodiment, each of the first memristor MS1 and the second memristor MS2 may be a phase-change memory (PCM) element, a magnetoresistive random access memory (MRAM) element, a resistive random access memory (ReRAM) element, or a ferroelectric random access memory (FeRAM) element. For example, the phase-change material of the phase-change storage unit is switched between a crystalline state and a non-crystalline state by applying appropriate current. The different states (such as the crystalline state, the semi-crystalline state and the non-crystalline state) of a phase-change material imply different resistances. Generally, compared with the crystalline phase change material, the non-crystalline state of the phase change material has a higher resistance. In one embodiment, the phase-change material is a sulfide or alloy of germanium (Ge), antimony (Sb) or tellurium (Te). In one embodiment, the state of the first memristor MS1 is opposite the state of the second memristor MS2. In other words, one of the first memristor MS1 and the second memristor MS2 has a higher resistance, and the other one has a lower resistance.

In the embodiment shown in FIG. 1 or FIG. 2, two ends of the first switch S1 are respectively connected with the first memristor MS1 and the second memristor MS2. Therefore, the first memristor MS1, the first switch S1 and the second memristor MS2 are connected in series. The control end of the first switch S1 is connected with the read-word line RWL. Thus, the system can control the first switch S1 to selectively turn on or off through the read-word line RWL. While the first switch S1 is turned on, the first memristor MS1 and the second memristor MS2 are connected in series. While the first switch S1 is turned off, the first memristor MS1 and the second memristor MS2 are electrically independent from each other.

As mentioned above, the first end of the second switch S2 is connected with the first end of the first switch S1 and the second end of the first memristor MS1; the second end of the second switch S2 is electrically connected with the system ground terminal; the control end of the second switch S2 is connected with the program line PG. Thus, the system can control the second switch S2 to selectively turn on or off, i.e. selectively control the first memristor MS1 to be grounded, through the program line PG. Similarly, the first end of the third switch S3 is connected with the second end of the first switch S1 and the first end of the second memristor MS2; the second end of the third switch S3 is electrically connected with the system ground terminal; the control end of the third switch S3 is connected with the program line PG. Thus, the system can control the third switch S3 to selectively turn on or off, i.e. selectively control the second memristor MS2 to be grounded, through the program line PG.

In one embodiment, each of the first switch S1, the second switch S2, the third switch S3 and the fourth switch S4 may be a semiconductor transistor, such as a field effect transistor (FET). In one embodiment, each of the first switch S1, the second switch S2, the third switch S3 and the fourth switch S4 may be a metal oxide semiconductor field effect transistor (MOSFET). It is well known by the persons skilled in the art: the gate of MOSFET may be made of a non-metallic material, such as polysilicon. Besides, for MOSFETs having identical driving capability, an N-type MOSFET occupies smaller area than a P-type MOSFET. Therefore, in one embodiment, each of the first switch S1, the second switch S2, the third switch S3 and the fourth switch S4 may be an N-type MOSFET but are not limited thereto. In other embodiments, P-type MOSFETs or other switch elements (such as Fin-type FETs (FinFETs)) may be used as the first switch S1, the second switch S2, the third switch S3 and the fourth switch S4.

Figure 3:
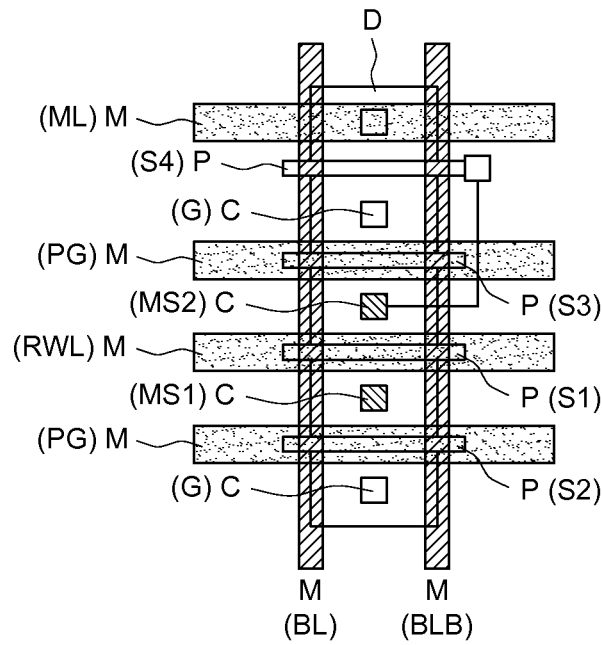
FIG. 3 is a diagram schematically showing an IC layout of a non-volatile storage unit according to one embodiment of the present invention.

Referring to FIG. 3, FIG. 3 illustrates a circuit layout of a non-volatile storage unit according to one embodiment of the present invention, wherein symbol D denotes a diffusion layer, symbol M denotes a metallic layer, symbol P denotes a polysilicon layer, and symbol C denotes a contact layer. Besides, the parenthesized symbols denote the same elements in FIG. 3 as in FIG. 1, wherein symbol G denotes the system ground terminal. In FIG. 3, two ends of the first switch S1 are respectively connected with the first memristor MS1 and the second memristor MS2; two ends of the second switch S2 are respectively connected with the first memristor MS1 and the system ground terminal G; two ends of the third switch S3 are respectively the second memristor MS2 and the system ground terminal G; two ends of the fourth switch S4 are respectively connected with the match line ML and the system ground terminal G. As long as the abovementioned elements of the non-volatile storage unit are disposed according to the normal IC layout design rule, the layout thereof will naturally meet the memristor layout design rule, i.e. adjacent memristors have appropriate spacing therebetween.

For example, the first switch S1 is used to separate the first memristor MS1 and the second memristor MS2 and form appropriate spacing therebetween, which meets the memristor layout design rule. The non-volatile storage units of the present invention are normally fabricated into an array, wherein the first memristor MS1 of one non-volatile storage unit is separated from the second memristor MS2 of the adjacent non-volatile storage unit by the second switch S2, the third switch S3 and the fourth switch S4 to form appropriate spacing therebetween. In other words, disposing appropriate elements between adjacent memristors not only meets the layout design rule but also fully utilizes the space therebetween without wasting the chip area.

Figure 4:
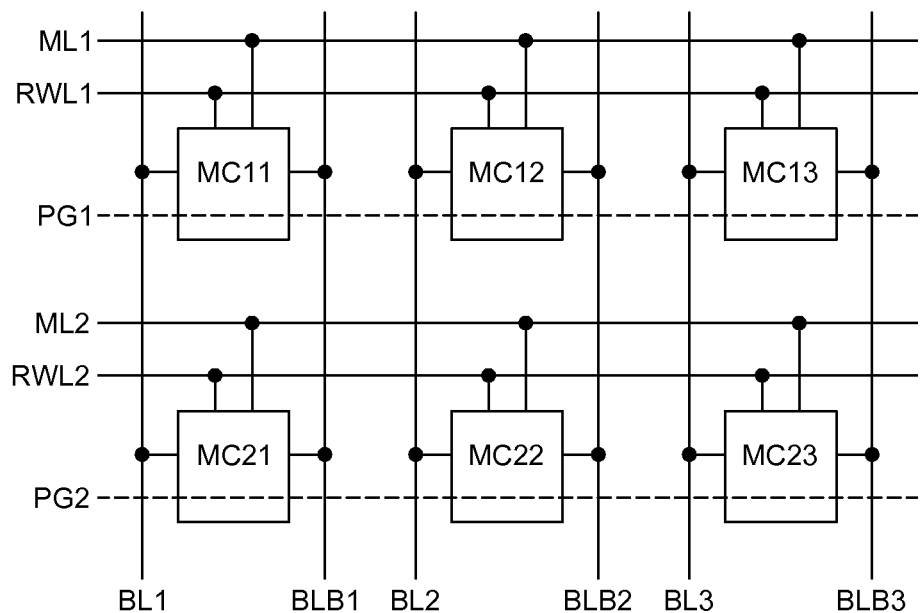
FIG. 4 is a diagram schematically showing a non-volatile storage device according to one embodiment of the present invention.

Referring to FIG. 4, FIG. 4 illustrates a non-volatile storage device according to one embodiment of the present invention. In FIG. 4, the non-volatile device of the present invention comprises a plurality of non-volatile storage units MC, as shown in FIG. 1 and FIG. 2 respectively, denoted by symbols MC11-MC23. Each of the non-volatile storage units MC11-MC23 stores a bit of data. Each of the non-volatile storage units MC11-MC23 is connected with a read-word line RWL1 or RWL2, a bit line BL1, BL2, or BL3, a bit line bar BLB1, BLB2, or BLB3, a program line PG1 or PG2, a match line ML1 or ML2, and a system ground terminal, which are corresponding to the non-volatile storage unit. The technical details of the non-volatile storage units MC11-MC23 have been described above and will not repeat herein.

Figure 5A:
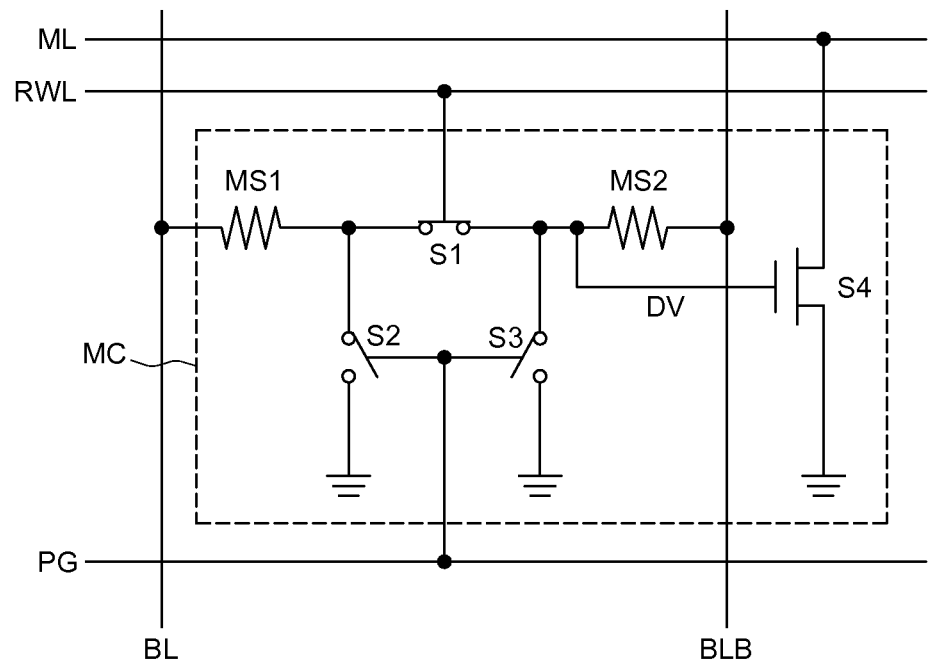
FIG. 5*a* is a diagram schematically showing an equivalent circuit of a non-volatile storage unit in a read-data mode according to one embodiment of the present invention.
Figure 5B:
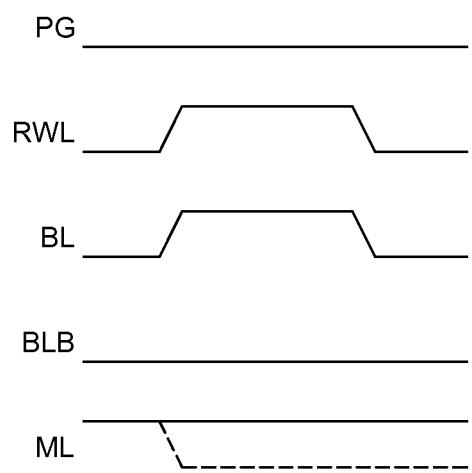
FIG. 5*b* is a diagram schematically showing input signals and output signals of a non-volatile storage unit in a read-data mode according to one embodiment of the present invention.

Referring to FIG. 5a and FIG. 5b, FIG. 5a and FIG. 5b illustrate the operation of a non-volatile storage unit and the related timing sequences of the input signals and output signals thereof in a read-data mode. The match line ML is pre-charged to a high-level voltage before the read-data mode starts, and then the read-data operation is executed. In the embodiment where the first switch S1, the second switch S2, the third switch S3 and the fourth switch S4 are N-type MOSFETs, the input signal of the program line PG is set to be a low-level voltage to control the second switch S2 and the third switch S3 to turn off; the input signal of the read-word line RWL is set to be a high-level voltage to control the first switch S1 to turn on and connect the first memristor MS1 and the second memristor MS2 in series. Suppose that the first memristor MS1 is in a high resistance state and the second memristor MS2 is in a low resistance state. While the input signal of the bit line BL is a high-level voltage and the input signal of the bit line bar BLB is a low-level voltage, the current flows from the bit line BL, through the first memristor MS1, the first switch S1 and the second memristor MS2, to the bit line bar BLB. As the first memristor MS1 is in a high resistance state, there is a higher voltage drop across the first memristor MS1. In other words, the divided voltage DV outputted by the node between the first switch S1 and the second memristor MS2 (may be regarded as the node between the first memristor MS1 and the second memristor MS2) is a low-level voltage. The divided voltage DV controls the fourth switch S4 to turn off. Thus, the output signal of the match line ML is maintained to be a high-level voltage.

On the contrary, while the input signal of the bit line BL is a low-level voltage and the input signal of the bit line bar BLB is a high-level voltage, the current flows from the bit line bar BLB, through the second memristor MS2, the first switch S1 and the first memristor MS1, to the bit line BL. As the second memristor MS2 is in a low resistance state, there is a smaller voltage drop across the second memristor MS2. In other words, the divided voltage DV is a high-level voltage, which controls the fourth switch S4 to turn on. Thus, the pre-charged match line ML discharges through the fourth switch S4 to the system ground terminal. Then, the match line ML reaches the ground voltage. In other words, the output signal of the match line ML is a low-level voltage, as shown by the dashed line in FIG. 5b.

Similarly, suppose that the first memristor MS1 is in a low resistance state and the second memristor MS2 is in a high resistance state. While the input signal of the bit line BL is a high-level voltage and the input signal of the bit line bar BLB is a low-level voltage, the current flows from the bit line BL, through the first memristor MS1, the first switch S1 and the second memristor MS2, to the bit line bar BLB. As the first memristor MS1 is in a low resistance state, there is a smaller voltage drop across the first memristor MS1. Therefore, the divided voltage DV is a high-level voltage, which controls the fourth switch S4 to turn on. Thus, the pre-charged match line ML discharges through the fourth switch S4 to the system ground terminal. Then, the match line ML reaches the ground voltage. In other words, the output signal of the match line ML is a low-level voltage. On the contrary, while the input signal of the bit line BL is a low-level voltage and the input signal of the bit line bar BLB is a high-level voltage, the current flows from the bit line bar BLB, through the second memristor MS2, the first switch S1 and the first memristor MS1, to the bit line BL. As the second memristor MS2 is in a high resistance state, there is a greater voltage drop across the second memristor MS2. Therefore, the divided voltage DV is a low-level voltage, which controls the fourth switch S4 to turn off. Thus, the output signal of the match line ML is maintained to be a high-level voltage. Whether the data input to the non-volatile storage unit matches the data stored in the first memristor MS1 and the second memristor MS2 depends on the output signal of the match line ML is a high-level voltage or a low-level voltage.

Figure 6A:
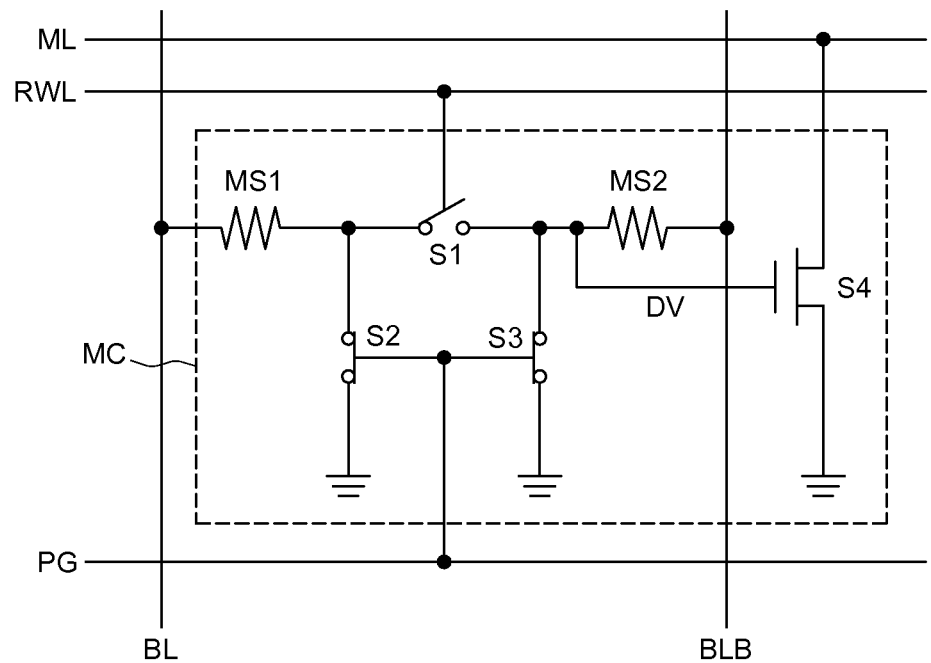
FIG. 6*a* is a diagram schematically showing an equivalent circuit of a non-volatile storage unit in a write-data mode according to one embodiment of the present invention.
Figure 6B:
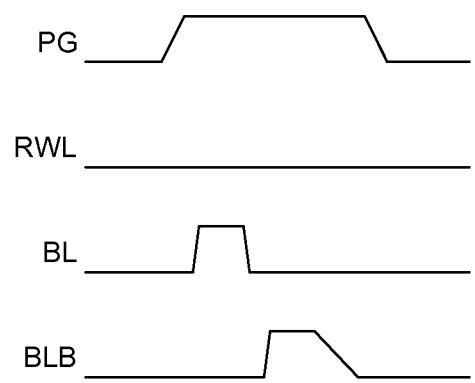
FIG. 6*b* is a diagram schematically showing input signals and output signals of a non-volatile storage unit in a write-data mode according to one embodiment of the present invention.

Referring to FIG. 6a and FIG. 6b, FIG. 6a and FIG. 6b illustrate the operation of a non-volatile storage unit and the related timing sequences of the input signals and output signals thereof in a write-data mode. The non-volatile storage unit whose first switch S1, second switch S2, third switch S3 and fourth switch S4 are N-type MOSFETs is used as the exemplification. In the write-data mode, the input signal of the read-word line RWL is set to be a low-level voltage to control the first switch S1 to turn off, whereby the first memristor MS1 and the second memristor MS2 are electrically separated from each other; the input signal of the program line PG is set to be a high-level voltage to control the second switch S2 and the third switch S3 to turn on, whereby the first memristor MS1 and the second memristor MS2 are connected with the system ground terminal. While the input signal of the bit line BL is a high-level voltage, the current flows from the bit line BL, through the first memristor MS1 and the second switch S2, to the ground. Therefore, the state of the first memristor MS1 can be varied via changing the input voltage of the bit line BL. For example, the signal waveforms in FIG. 6b are used to set the state of the phase-change memory, and the first memristor MS1 is set to be in an amorphous state, i.e. a high resistance state. While the input signal of the bit line bar BLB is a high-level voltage, the current flows from the bit line bar BLB, though the second memristor MS2 and the third switch S3, to the ground. Therefore, the state of the second memristor MS2 can be varied via changing the input voltage of the bit line bar BLB. For example, the signal waveforms in FIG. 6b are used to set the state of the phase-change memory, and the second memristor MS2 is set to be in a crystalline state, i.e. a low resistance state.

In the non-volatile storage unit described above, the first memristor MS1 can be set to have a first resistance via writing a first pulse through the bit line BL; the second memristor MS2 can be set to have a second resistance via writing a second pulse through the bit line bar BLB. In one embodiment, each of the first pulse and the second pulse may be a voltage pulse or a current pulse. The first resistance of the first memristor MS1 is logically complementary to the second resistance of the second memristor MS2. While the first resistance is a high resistance, the second resistance is a low resistance, and while the first resistance is a low resistance, the second resistance is a high resistance. In one embodiment, the ratio of the high resistance to the low resistance is 5:1, preferably 10:1.

The content addressable memory (CAM) is used to exemplify the non-volatile storage unit of the present invention in the above description. However, the present invention does not limit that the non-volatile storage unit must be CAM. The non-volatile storage unit is also applicable to other electronic devices. For example, a programmable logic device (PLD) may include the non-volatile storage units of the present invention and use the data stored in the first memristors MS1 and the second memristor MS2 to execute logic operations.

In conclusion, the non-volatile storage unit and the non-volatile storage device of the present invention adopt memristors to store data, using fewer transistors to realize the same circuit function, reducing the chip area, and exempted from reloading data into the storage units. Compared with the conventional SRAM, the present invention can greatly reduce the time and energy spent in initiating the device. Further, the present invention disposes appropriate electronic elements in the spacing between adjacent memristors to meet the layout design rule and achieve high space efficiency in the chip lest the space between memristors be wasted.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the scope of the appended claims.

What is claimed is:

1. A non-volatile storage unit, comprising:
  a first memristor having a first end and a second end, wherein the first end of the first memristor is connected with a bit line;
  a first switch having a first end, a second end and a control end, wherein the first end of the first switch is connected with the second end of the first memristor, and the control end of the first switch is connected with a read-word line;
  a second memristor having a first end and a second end, wherein the first end of the second memristor is connected with the second end of the first switch, and the second end of the second memristor is connected with a bit line bar; and
  a write-data circuit electrically coupled to the first end of the first switch, the second end of the first switch, a program line and a system ground terminal.

2. The non-volatile storage unit according to claim 1, further comprising:
  a fourth switch having a first end, a second end and a control end, wherein the first end of the fourth switch is connected with a match line, the second end of the fourth switch is electrically connected with the system ground terminal, and the control end of fourth switch is connected with the first end or the second end of the first switch.

3. The non-volatile storage unit according to claim 2, wherein the circuit comprises:
  a second switch having a first end, a second end and a control end, wherein the first end of the second switch is connected with the first end of the first switch and the second end of the first memristor, and the second end of the second switch is electrically connected with the system ground terminal; and
  a third switch having a first end, a second end and a control end, wherein the first end of the third switch is connected with the second end of the first switch and the first end of the second memristor, the second end of the third switch is electrically connected with the system ground terminal, and the control end of the third switch and the control end of the second switch are jointly electrically connected with the program line.

4. The non-volatile storage unit according to claim 3, wherein in a write-data mode,
  the first switch is controlled to turn off through the read-word line, and the second switch and the third switch are controlled to turn on through the program line;
  the first memristor is set to have a first resistance via writing a first pulse through the bit line; and
  the second memristor is set to have a second resistance via writing a second pulse through the bit line bar.

5. The non-volatile storage unit according to claim 4, wherein each of the first pulse and the second pulse is a voltage pulse or a current pulse.

6. The non-volatile storage unit according to claim 4, wherein the first resistance is a high-level value and the second resistance is a low-level value, or the first resistance is a low-level value and the second resistance is a high-level value.

7. The non-volatile storage unit according to claim 3, wherein in a read-data mode,
  the match line is controlled to have a high-level voltage;
  the second switch and the third switch are controlled to turn off through the program line;
  the first switch is controlled to turn on through the read-word line for electrically connecting the first memristor and the second memristor in series; the first end or the second end of the first switch outputs a divided voltage to the control end of the fourth switch for controlling the fourth switch to turn on or off.

8. The non-volatile storage unit according to claim 3, wherein each of the first switch, the second switch, the third switch and the fourth switch comprises a semiconductor transistor.

9. The non-volatile storage unit according to claim 1, wherein each of the first memristor and the second memristor is a phase-change memory element, a magnetoresistive random access memory element, a resistive random access memory element, or a ferroelectric random access memory element.

10. A non-volatile storage device, comprising:
a plurality of nonvolatile storage units according to claim 1, wherein each the non-volatile storage unit stores a bit of data, and wherein each the non-volatile storage unit is coupled to a read-word line, a bit line, a bit line bar, a program line, a match line and a system ground terminal, which are corresponding to the non-volatile storage unit.

* * * * *